United States Patent [19]
Koizumi et al.

[11] Patent Number: 5,770,981
[45] Date of Patent: Jun. 23, 1998

[54] COMPOSITE MICROWAVE CIRCUIT MODULE HAVING A PSEUDO-WAVEGUIDE STRUCTURE

[75] Inventors: Takao Koizumi; Yuhei Kosugi, both of Tokyo, Japan

[73] Assignee: NEC Corporation, Japan

[21] Appl. No.: 625,715

[22] Filed: Mar. 28, 1996

[30] Foreign Application Priority Data

Mar. 31, 1995 [JP] Japan .................................. 7-075098

[51] Int. Cl.[6] .................................................. H01P 5/107
[52] U.S. Cl. .............................................. 333/26; 333/33
[58] Field of Search ............................... 333/26, 33, 246; 343/700 MS, 770

[56] References Cited

U.S. PATENT DOCUMENTS

| 2,877,429 | 3/1959 | Sommers et al. ................... 333/239 X |
| 3,518,688 | 6/1970 | Stayboldt et al. ...................... 343/771 |
| 5,450,046 | 9/1995 | Kosugi et al. ........................ 333/26 X |

FOREIGN PATENT DOCUMENTS 13029   6/1994   WIPO .............................. H01Q 1/38

Primary Examiner—Benny T. Lee
Attorney, Agent, or Firm—Ostrolenk, Faber, Gerb & Soffen, LLP

[57] ABSTRACT

A composite microwave circuit module includes a multilayer dielectric substrate, upper- and lower-surface grounds, an antenna pattern, a plurality of shield via holes, and a large number of first holes. The upper- and lower-surface grounds are formed on upper and lower surfaces of the multilayer dielectric substrate, respectively, and the upper-surface ground has an opening portion for waveguide coupling. The antenna pattern is formed on an interlayer of the multilayer dielectric substrate by a high-frequency signal line in correspondence with the opening portion. The plurality of shield via holes are formed around the antenna pattern and filled with a filler material to form a pseudo waveguide structure. The first holes have cavities formed in the multilayer dielectric substrate in correspondence with the pseudo waveguide structure between the antenna pattern and the opening portion of the upper-surface substrate. A method of manufacturing this circuit module is also disclosed.

8 Claims, 5 Drawing Sheets

COMPOSITE MICROWAVE CIRCUIT MODULE HAVING A PSEUDO-WAVEGUIDE STRUCTURE

BACKGROUND OF THE INVENTION

The present invention relates to a composite microwave circuit module and a method of manufacturing the same and, more particularly, to a composite microwave circuit module comprising a multilayer dielectric substrate suitable for high-frequency signal line/waveguide conversion, and a method of manufacturing the same.

Elements of a conventional composite microwave circuit module are shown in either one or both of FIGS. 4 and 5. In the composite microwave circuit module, an upper-surface ground 3 and a lower-surface ground 4 (FIG. 5); are formed on the upper and lower surfaces of a multilayer dielectric substrate 1 (FIG. 4) respectively, and a high-frequency signal line 8 (FIG. 5); for transmitting a signal is formed on a high-frequency signal layer 23 (FIG. 5); as an interlayer. Shield via holes 2 (FIG. 5) filled with a conductive material such as silver or copper are formed to electrically connect the upper-surface ground 3 to the lower-surface ground 4 and provide a shield effect. A cavity 11 (FIG. 5) is formed by removing a portion from the surface to the high-frequency signal layer 23 (FIG. 5), in which an active element 20 and a passive element 21 (FIG. 4) are mounted. After these elements are mounted, and electrical adjustment is completed, the cavity 11 is sealed with a metal cap 12, thereby protecting the elements from dust and humidity and electrically shielding the elements.

The high-frequency signal line 8 is realized by a strip line, a microstrip line, a coplanar line, or the like.

In FIG. 4, pseudo waveguides are shown as 6 and 7, and an antenna pattern as 10. In FIG. 5, a voltage pattern or power supply pattern is shown as 22, and bonding wires as 13.

FIGS. 3A and 3B show the waveguide connection structure of such a composite microwave circuit module consisting of a multilayer dielectric substrate, in which a waveguide is used to connect the high-frequency signal layer. Elements of the waveguide connection are shown in either one or both of FIGS. 3A and 3B.

An antenna pattern 10 is formed by the high-frequency signal line 8 on the interlayer, and an adjustment pattern 14 (FIG. 3B) is formed around the antenna pattern 10. The lower layer has a cavity structure. The antenna pattern 10 and the adjustment pattern 14 are connected by bonding wires 13 (FIG. 3B), thereby performing electrical adjustment. FIG. 3A shows the cavity 11 sealed with the metal cap 12 after electrical adjustment.

The cavity 11 is surrounded by the shield via holes 2 connected to the upper-surface ground 3 and the lower-surface ground 4 (FIG. 3A) to provide the shield effect. This structure functions as a pseudo waveguide in the substrate. An opening 15 having the same shape as the sectional shape of the waveguide is formed in the upper-surface ground 3. A waveguide 5 (FIGS. 3A and 4) is electrically connected to the opening 15 through a metal shim 19 (FIGS. 3A and 4).

Some radio waves radiated from the antenna pattern 10 are transmitted through the upper ceramic substrate 1 and reach the waveguide 5, and the remainings are transmitted through the lower cavity 11, reflected by the metal cap 12, and then reach the waveguide 5. The depth of the cavity 11 is set at ¼ the wavelength of the frequency in use. The radio waves reflected by the metal cap 12 return to the antenna pattern 10, where these radio waves and those transmitted to the upper layer are in phase and intensify each other.

This is the waveguide connection structure of a microwave circuit module.

In the above-described conventional waveguide connection structure of a microwave circuit module, however, the degree of freedom of design for matching impedances between the waveguide and the layers above and below the antenna pattern in the substrate is low, so substantially no impedance matching design is available. In addition, in the pseudo waveguide, radio waves are attenuated due to a dielectric loss caused by the ceramic material, i.e., the dielectric substrate.

SUMMARY OF THE INVENTION

It is an object of the present invention to provide a composite microwave circuit module which increases the degree of freedom of design for matching impedances between layers above and below an antenna pattern, and a method of manufacturing the same.

It is another object of the present invention to provide a composite microwave circuit module which decreases attenuation of radio waves due to the dielectric loss of a dielectric material to improve electrical characteristics, and a method of manufacturing the same.

In order to achieve the above objects, according to the present invention, there is provided a composite microwave circuit module comprising a multilayer dielectric substrate, upper- and lower-surface grounds formed on upper and lower surfaces of the multilayer dielectric substrate, respectively, the upper-surface ground having an opening portion for waveguide coupling, an antenna pattern formed on an interlayer of the multilayer dielectric substrate by a high-frequency signal line in correspondence with the opening portion, a plurality of shield via holes formed around the antenna pattern, the shield via holes being filled with a filler material to form a pseudo waveguide structure, and a large number of first holes having cavities formed in the multilayer dielectric substrate in correspondence with the pseudo waveguide structure between the antenna pattern and the opening portion of the upper-surface substrate.

DESCRIPTION OF THE PREFERRED EMBODIMENTS

Figure 1A:
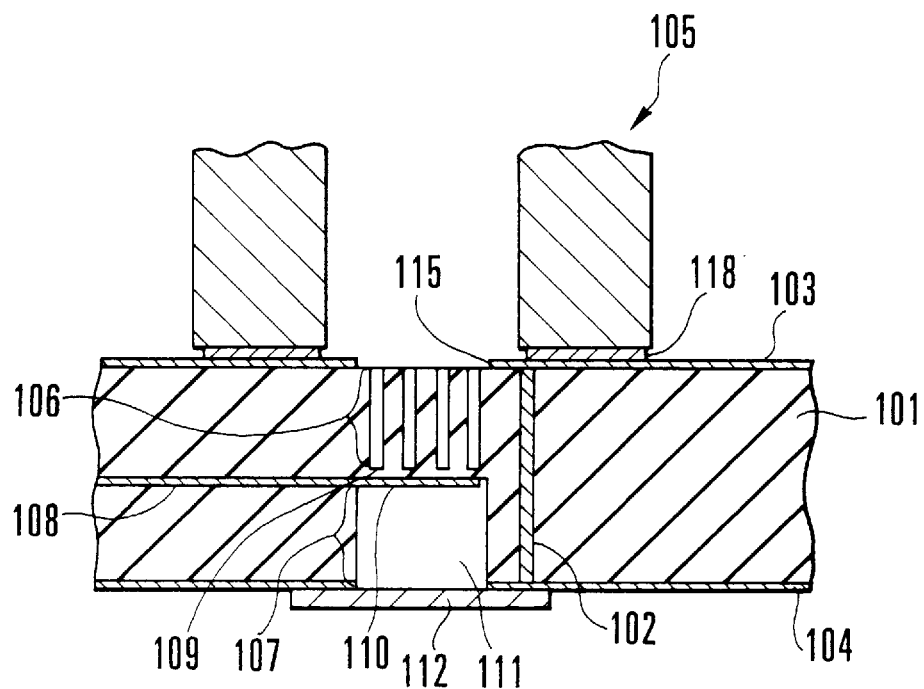
FIG. 1A is a sectional view of a composite microwave circuit module according to the first embodiment of the present invention.
Figure 1B:
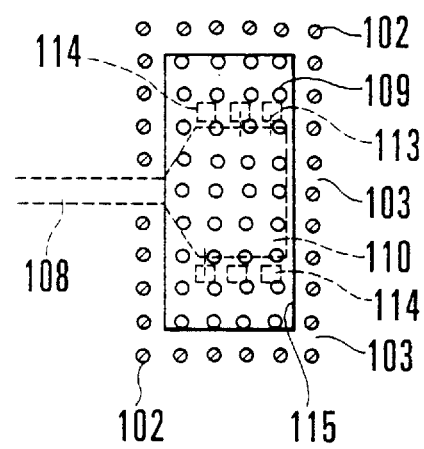
FIG. 1B is a plan view of the upper surface of a multilayer dielectric substrate for waveguide connection shown in FIG. 1A.

FIGS. 1A and 1B show the first embodiment of the present invention; elements of which are shown in one or both of FIGS. 1A and 1B. FIG. 1A shows the waveguide connection structure of a microwave circuit module, and FIG. 1B shows the upper surface of a pseudo waveguide connection structure consisting of a multilayer substrate for waveguide connection.

Referring to FIGS. 1A and 1B, the waveguide connection structure of this embodiment is characterized by hollow via holes called holes 109 in the pseudo waveguide of a multilayer dielectric substrate 101 (FIG. 1A).

An upper-surface ground 103 and a lower-surface ground 104 (FIG. 1A) are formed on the upper and lower surfaces of the composite microwave circuit module consisting of the multilayer dielectric substrate 101 (FIG. 1A) made of a ceramic material, respectively. A high-frequency signal line 108 for transmitting a high-frequency signal is formed on a high-frequency signal layer as an interlayer. To radiate radio waves from the high-frequency signal line 108 toward a waveguide 105 (FIG. 1A) an antenna pattern 110 is formed on the high-frequency signal layer, and an adjustment pattern 114 (FIG. 1A) is formed near the antenna pattern 110. Shield via holes 102 each having a diameter of several tens to several hundreds μm and filled with a conductive material such as silver or copper are formed around the antenna pattern at an interval of several tens to several hundreds μm. The upper-surface ground 103 is connected to the lower-surface ground 104 (FIG. 1A) through the shield via holes 102, thereby forming a pseudo waveguide structure (to be described later).

A cavity 111 (FIG. 1A) formed below the antenna pattern 110 to form a cavity structure. When the antenna pattern 110 and the adjustment pattern 114 are selectively connected by a bonding wire 113 (FIG. 1B), adjustment is performed so that radio waves are efficiently radiated from the antenna pattern 110 to the pseudo waveguide structure through the cavity structure. After adjustment, the cavity 111 is hermetically sealed by a metal cap 112 (FIG. 1A). The cavity structure portion below the antenna pattern 110 constitutes a pseudo waveguide structure 107 (FIG. 1A) whose end face serves as the short surface of the waveguide 105. The depth of the cavity 111 is set at ¼ the wavelength of a radio wave in use.

The large number of holes 109 each having a diameter of several tens to several hundreds μm are formed in the dielectric substrate 101 above the antenna pattern 110, which is made of a ceramic material, at an interval of several tens to several hundreds μm. The holes 109 are formed in the same processes as those for forming the shield via holes 102, though the holes 109 are hollow because they are not filled with a filler. The forming processes will be described later. The portion of the holes 109 above the antenna pattern 110 forms a pseudo waveguide structure 106 (FIG. 1A). When the size and interval of the holes 109 are changed, the effective permittivity of the pseudo waveguide structure 106 can be adjusted. The length of the pseudo waveguide structure 106 is set at ¼ the wavelength of radio waves in use.

Referring to (FIG. 1A), the waveguide 105 and the pseudo waveguide structures 106 and 107 of the composite microwave circuit module are most effectively connected when the following condition is satisfied:

$$Z_A = \sqrt{Z_0 \cdot Z_B}$$

where $Z_O$, $Z_A$, and $Z_B$ are the impedances of the waveguide 105 and the pseudo waveguide structures 106 and 107 respectively. The effective permittivity in the pseudo waveguide structure 106 can be changed by forming the holes 109, so that a design for satisfying this impedance condition can be obtained. In addition, since the dielectric loss is reduced by the holes 109, a structure with a minimum loss can be obtained.

A rectangular opening portion 115 is formed in the upper-surface ground 103 at a portion where the waveguide 105 is connected. Radio waves radiated from the antenna pattern 110 are guided to the waveguide 105 through the opening portion 115. A pressurized anisotropic conductive film 118 (FIG. 1A) is used to connect the waveguide 105 to the upper-surface ground 103.

The processes for forming the holes 109 will be briefly described below. The ceramic material as the substrate material of the multilayer dielectric substrate 101 (FIG. 1A) is formed into a substrate by stacking a large number of ceramic sheets called a green sheet with a thickness of several tens μm and calcining the green sheets. The green sheet is fabricated in the following processes.

① The shield via holes 102 and the holes 109 or the cavity 111 are formed in the green sheet by using a die or the like.

② A metal mask is used to fill a conductive material in opening portions serving as the shield via holes 102.

The metal mask prevents the conductive material from being filled in opening portions serving as the holes 109.

③ A metal screen is used to form the patterns of the high-frequency signal line 108 and the grounds 103 and 104 with a conductive material.

Green sheets for all layers are subjected to processes ① to ③. Only the green sheets for the interlayer and the upper and lower surfaces are subjected to the process ③. The green sheets are positioned and stacked. The green sheets are calcined to form the multilayer dielectric substrate 101. The holes 109 formed in this manner become hollow.

Figure 2:
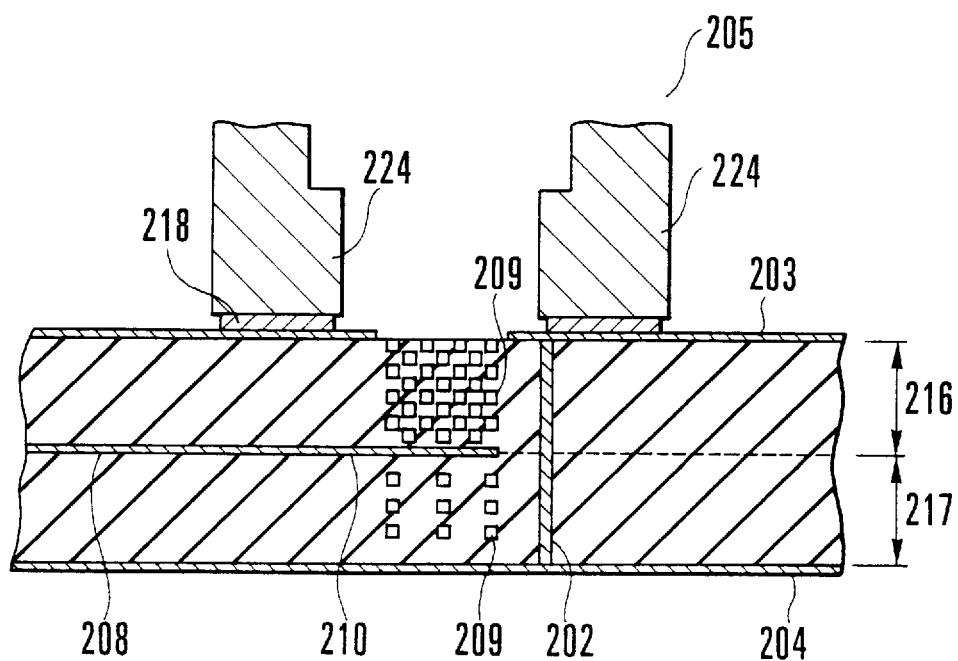
FIG. 2 is a sectional view showing a composite microwave circuit module according to the second embodiment of the present invention.
Figure 3A:
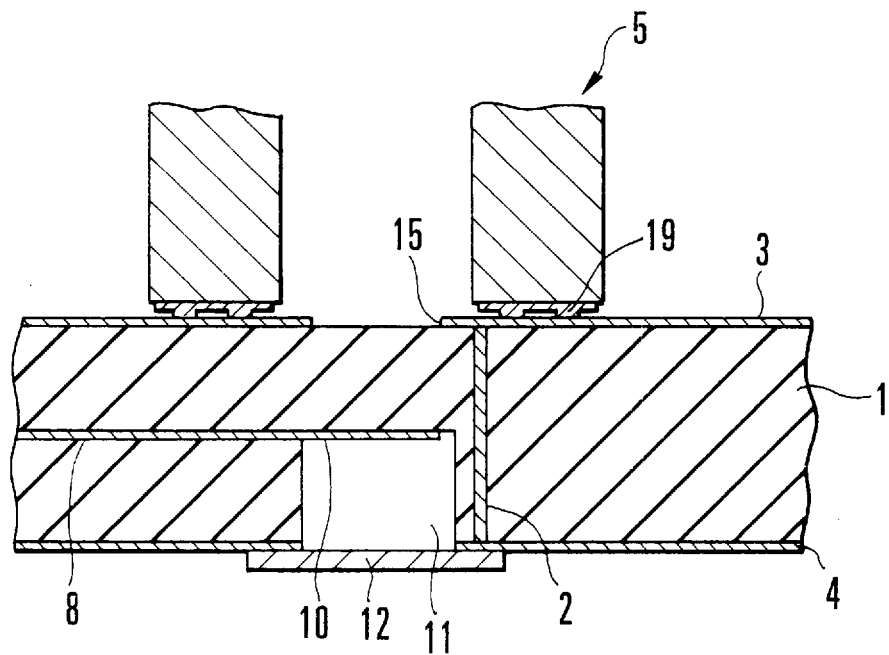
FIG. 3A is a sectional view of a conventional microwave circuit module.
Figure 3B:
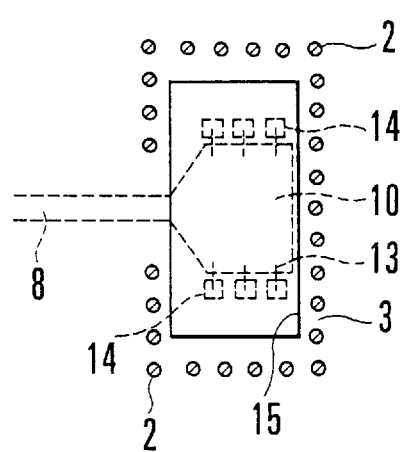
FIG. 3B is a plan view of the upper surface of a multilayer dielectric substrate for waveguide connection shown in FIG. 3A.
Figure 4:
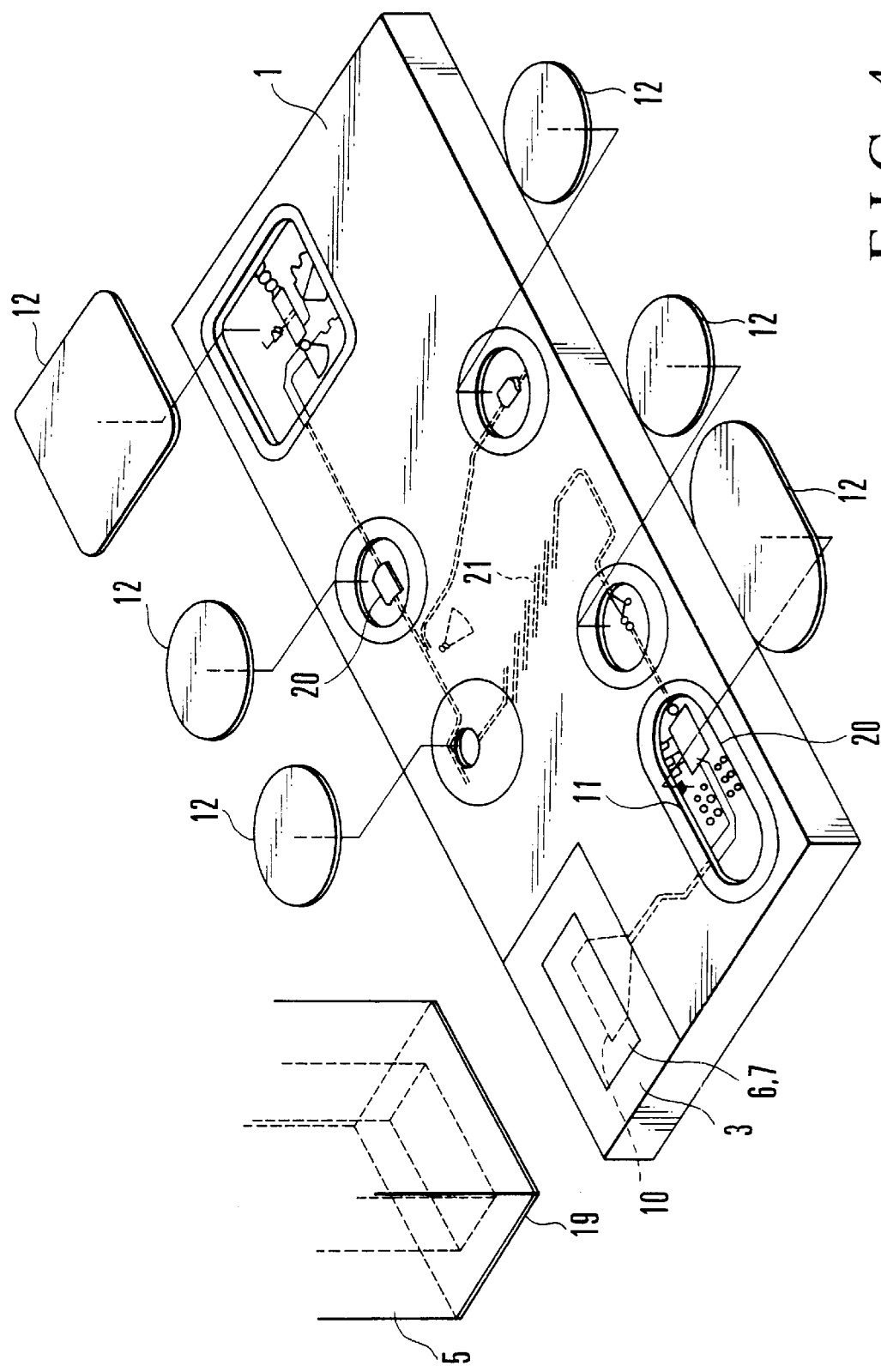
FIG. 4 is a perspective view of the conventional microwave circuit module.
Figure 5:
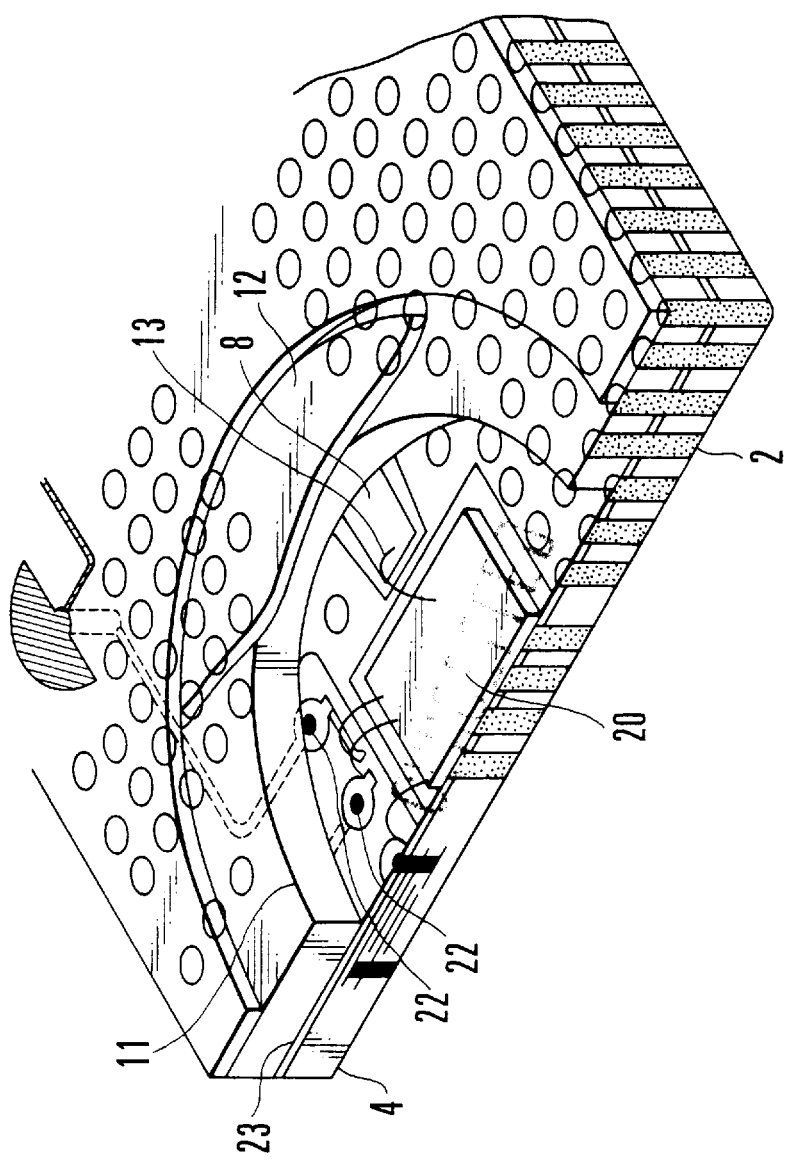
FIG. 5 is an explanatory view of the sectional portion of the main part of the microwave circuit module shown in FIG. 4.

The second embodiment shown in FIG. 2 will be described. Holes 209 are formed in green sheets above and below an antenna pattern 210 on an interlayer of a composite microwave circuit module. The positions of the holes 209 are changed for each layer to obtain a uniform distribution of the holes 209 in the pseudo waveguide, resulting in a more excellent structure for propagation of radio waves. In addition, a dielectric material 217 below a high-frequency signal line 208 has a permittivity different from that of a dielectric material 216 above the high-frequency signal line 208, so that the degree of freedom of impedance design of the pseudo waveguide structure is improved.

A waveguide 205 has a thick end portion 224, i.e., from an end face as the connection portion to an upper-surface ground 203 to a point separated by ¼ the wavelength of the radio wave in use, thereby forming a low-impedance structure. With this structure, the electrical characteristics in connection to the circuit module are further improved. Reference numeral 204 denotes a lower-surface ground; reference numeral 208, the high-frequency signal line; and reference numeral 218, a pressurized anisotropic conductive film.

The structure of the multilayer dielectric substrate of the present invention is not limited to the above embodiments. More specifically, the holes and via holes formed in the multilayer dielectric substrate may have arbitrary sectional shapes other than a circular shape. As for the arrangement of the holes, holes having a shape as shown in FIG. 1 or 2 may be arranged in a non-uniform distribution, or a plurality of holes having different sizes may be combined. To arrange holes while changing the positions for each layer, as shown in FIG. 2, the holes may be arranged in a matrix while partially overlapping to communicate with each other. In addition, the holes having the above-described various shapes and arrangements can be formed on both the sides or on one side of the antenna pattern in an arbitrary combination. With this structure, the degree of freedom of design for impedance matching in connection between the waveguide and the substrate can be obviously increased, so that the characteristics can be improved.

The waveguide connection structure can be applied to not only the high-frequency signal transmission system but also a reception system, as a matter of course.

As has been described above, according to the composite microwave circuit module of the present invention, a large number of fine hollow holes are formed in the pseudo waveguide formed by the shield via holes surrounding the antenna pattern on the interlayer of the multilayer dielectric substrate. When the shape, arrangement interval, density, and the like of the holes are changed, the effective permittivity in the pseudo waveguide can be controlled.

With this structure, the degree of freedom of design for obtaining satisfactory impedance matching in connection between the waveguide and the substrate can be increased, so that a connection structure with excellent characteristics can be designed. When the dielectric substrate above the antenna pattern is formed of a material different from that of the lower dielectric substrate to change the permittivity, and the above hole arrangement is simultaneously applied, the degree of freedom of impedance design in the pseudo waveguide can be further increased. Since the holes are hollow, attenuation of radio waves due to the dielectric loss in the pseudo waveguide can be decreased.

When a cavity structure is formed on the lower-surface ground side of the antenna pattern, radio waves radiated to the cavity side can be effectively reflected to the waveguide side, so that an efficient pseudo waveguide can be constituted.

In addition, according to the method of manufacturing the composite microwave circuit module of the present invention, when the substrate is to be manufactured, the holes can be formed simultaneously in processes of forming the via holes in each green sheet serving as the base material of the multilayer ceramic substrate. For this reason, the labor for manufacturing the multilayer dielectric substrate does not increase as compared to the conventional manufacturing processes. Furthermore, since the pressurized anisotropic conductive film is used to connect the waveguide, no metal shim is necessary. Therefore, the cost can be reduced, and the operability in assembly can be improved.

What is claimed is:

1. A composite microwave circuit module comprising:
   a multilayer dielectric substrate;
   upper- and lower-surface grounds provided on upper and lower surfaces of said multilayer dielectric substrate, respectively, said upper-surface ground having an opening portion for waveguide coupling;
   an antenna pattern disposed on an interlayer of said multilayer dielectric substrate comprised of a high-frequency signal line in correspondence with the opening portion;
   a plurality of shield via holes provided surrounding said antenna pattern, the shield via holes including a filling of a filler material to define a pseudo waveguide structure;
   a large number of first holes having cavities provided in said multilayer dielectric substrate in correspondence with said pseudo waveguide structure between said antenna pattern and the opening portion of said upper-surface ground; and
   a cavity provided in said multilayer dielectric substrate in correspondence with said pseudo waveguide structure between said antenna pattern and said lower-substrate ground, and a metal cap for sealing the cavity.

2. A module according to claim 1, further comprising a large number of second holes having cavities provided in said multilayer dielectric substrate in correspondence with said pseudo waveguide structure between said antenna pattern and said lower-surface ground.

3. A module according to claim 1, wherein the first holes are provided by through holes extending through said multilayer dielectric substrate.

4. A module according to claim 1, wherein the first holes are arranged in a matrix, thereby obtaining a uniform distribution.

5. A module according to claim 1, wherein said multilayer dielectric substrate is constituted by a first layer between said high-frequency signal line and said upper-surface ground, and a second layer between said high-frequency signal line and said lower-surface ground, said first and second layers having different permittivities.

6. A module according to claim 1, further comprising a waveguide electrically and physically connected to the opening portion of said upper-surface ground and coupled to said pseudo waveguide structure.

7. A module according to claim 6, wherein said waveguide has a low-impedance structure from a connection portion of the opening portion of said upper-surface ground to a point corresponding to ¼ of a wavelength of a radio wave in use.

8. A composite microwave circuit module comprising:
   a multilayer dielectric substrate;
   upper- and lower-surface grounds provided on upper and lower surfaces of said multilayer dielectric substrate, respectively, said upper-surface ground having an opening portion for waveguide coupling;
   an antenna pattern disposed on an interlayer of said multilayer dielectric substrate comprised of a high-frequency signal line in correspondence with the opening portion;
   a plurality of shield via holes provided surrounding said antenna pattern, the shield via holes including a filling of a filler material to define a pseudo waveguide structure;
   a large number of first holes having cavities provided in said multilayer dielectric substrate in correspondence with said pseudo waveguide structure between said antenna pattern and the opening portion of said upper-surface around;
   a waveguide electrically and physically connected to the opening portion of said upper-surface ground and coupled to said pseudo waveguide structure; and
   a pressurized anisotropic conductive film electrically connecting the opening portion of said upper-surface ground to said waveguide.

* * * * *